United States Patent
Kato et al.

(10) Patent No.: US 6,858,800 B2
(45) Date of Patent: Feb. 22, 2005

(54) ELECTRONIC PART WITH A LEAD FRAME

(75) Inventors: Kazuhiro Kato, Higashiosaka (JP); Kenichiro Matsuzaki, Daito (JP)

(73) Assignees: Sanyo Electric Co., Ltd., Moriguchi (JP); Sanyo Electronic Components Co., Ltd., Daito (JP)

( * ) Notice: Subject to any disclaimer, the term of this patent is extended or adjusted under 35 U.S.C. 154(b) by 0 days.

(21) Appl. No.: 10/472,500

(22) PCT Filed: Apr. 12, 2002

(86) PCT No.: PCT/JP02/03709

§ 371 (c)(1),
(2), (4) Date: Oct. 1, 2003

(87) PCT Pub. No.: WO02/084734

PCT Pub. Date: Oct. 24, 2002

(65) Prior Publication Data

US 2004/0094322 A1 May 20, 2004

(30) Foreign Application Priority Data

Apr. 13, 2001 (JP) ........................... 2001-114692

(51) Int. Cl.[7] .............................................. H01L 23/48
(52) U.S. Cl. ...................... 174/52.2; 174/52.4; 257/693
(58) Field of Search ................... 174/52.1, 52.2, 174/52.3, 52.4; 257/666, 669, 670, 671, 693, 690, 696, 698, 734

(56) References Cited

U.S. PATENT DOCUMENTS

| | | | | |
|---|---|---|---|---|
| 3,735,214 A | * | 5/1973 | Renskers et al. | ........... 257/696 |
| 4,195,193 A | * | 3/1980 | Grabbe et al. | ............. 174/52.4 |
| 4,465,898 A |   | 8/1984 | Orcutt et al. | |
| 4,706,811 A | * | 11/1987 | Jung et al. | ................... 206/724 |
| 5,281,851 A | * | 1/1994 | Mills et al. | ................. 257/670 |
| 5,285,104 A | * | 2/1994 | Kondo et al. | ............... 257/666 |
| 5,471,097 A | * | 11/1995 | Shibata | ....................... 257/787 |

* cited by examiner

Primary Examiner—Dean A. Reichard
Assistant Examiner—Carmelo Oliva
(74) Attorney, Agent, or Firm—Armstrong, Kratz, Quintos, Hanson & Brooks, LLP

(57) ABSTRACT

An electronic component comprises an upper half housing segment and a lower half housing segment. A lead frame to be bent downward toward the lower housing segment projects laterally from an upper end portion of the lower housing segment. Projecting from a side wall upper end portion of the lower housing segment is a rib piece in contact with the lower surface of base end portion of the lead frame and plastically deformable when subjected to a bending force to be applied to the base end portion when the lead frame is bent.

5 Claims, 5 Drawing Sheets

ELECTRONIC PART WITH A LEAD FRAME

BACKGROUND OF THE INVENTION

1. Field of the Invention

The present invention relates to electronic components comprising a lead frame projecting from a side portion thereof, and more particularly to solid electrolytic capacitors.

2. Description of the Related Art

FIG. 7 is a perspective view showing a process for fabricating a solid electrolytic capacitor of the chip type, and FIG. 8 is a view in section taken along a plane containing the line A—A in FIG. 7 and showing the capacitor (see JP-B No. 3-30977).

With reference to FIG. 8, the solid electrolytic capacitor comprises a capacitor body 8 and a housing 7 made of a synthetic resin such as an epoxy resin or like thermosetting resin and covering the capacitor body. The capacitor has two lead frames 9, 90 electrically connected to the capacitor body 8 and projecting outward from respective opposite sides of the housing 7. The housing 7 comprises a lower half housing segment 71 and an upper half housing segment 70 provided on the segment 71. The lead frames 9, 90 are prepared from an alloy consisting mainly of iron and nickel.

The capacitor body 8 is fabricated in the following manner. An anode lead wire 2 is bonded or adhered to an anode body 1 which is a sintered body of valve metal, a dielectric oxide film 3 is formed on the anode body 1, and a cathode layer 4 of $MnO_2$ (manganese dioxide) or a solid electrically conductive material of electrically conductive organic compound is formed on the film 3 to prepare a capacitor element 5 first as already known. The term "valve metal" refers to a metal forming a dielectric oxide film which is very compact and durable when subjected to an electrolytic oxidation treatment. Examples of such metals are Ti (titanium), Nb (niobium), etc. in addition to Al and Ta. Examples of electrically conductive organic compounds are electrically conductive high polymers such as polypyrrol, polythiophene, polyaniline and polyfuran, TCNQ (7,7,8,8-tetracyanoquinodimethane) complex salt, etc. Use of the conductive organic compound for the cathode layer 4 provides a capacitor of lower ESR (equivalent series resistance) and excellent high-frequency characteristics.

A carbon layer 6 is formed over the cathode layer 4 of the capacitor element 5, and a silver paste layer 60 is formed over the carbon layer 6 to provide the capacitor body 8.

The lead frame 9 is attached to the anode lead wire 2 as by resistance welding, and the other lead frame 90 is attached to the silver paste layer 60 with a silver adhesive.

Further as shown in FIG. 7, an upper die 45 and a lower die 46 providing a space corresponding to the housing 7 are prepared, and the capacitor body 8 having the lead frames 9, 90 attached thereto is place into the lower die 46. A resin is filled into the space between the two dies 45, 46, and the dies are thereafter removed to obtain a housing 7 having the lead frames 9, 90 projecting therefrom. The upper half housing segment 70 and the lower half housing segment 71 are each provided with tapered surfaces at opposite sides thereof so that the dies are smoothly removable. The butting faces of the two dies 45, 46 are indicated as P.L. (parting line) in FIG. 8.

Next, the lead frames 9, 90 are placed on a bending jig 75 as shown in FIG. 9. A force acting downward is applied to the outer end of each of the lead frames 9, 90 to bend the lead frame so as to provide a first piece 91 extending outward from the housing 7 and a second piece 92 extending downward from the outer end of the first piece 91.

The housing 7 is thereafter held at its midportion by a jig 55 as seen in FIG. 10. A roller 76 is pressed against each first piece 91 from thereabove to bend the first piece 91 downward about its base end portion.

Each second piece 92 is positioned in contact with the bottom of the housing 7 as shown in FIG. 8. Current is passed through the lead frames 9, 90 for aging to complete a capacitor. The second pieces 92, 92 are soldered to a mount board (not shown).

However, the conventional construction involves the likelihood that the bending force to be applied to the base end portion of the first piece 91 in bending the first piece 91 downward will be greater than is needed due to variations in the bending load to be applied, permitting a crack to develop in the base end portion. The crack produced in the lead frame 9 or 10 impairs the characteristics of the capacitor such as ESR.

An object of the present invention is to reduce the bending force to be applied to the base end portion to prevent cracking.

SUMMARY OF THE INVENTION

The present invention provides an electronic component which comprises an upper half housing segment 70 and a lower half housing segment 71. Projecting laterally from the location of the boundary between the two housing segments 70, 71 is a lead frame 9 to be bent downward toward the lower housing segment 71.

Projecting from a side wall upper end portion of the lower housing segment 71 is a rib piece 72 in contact with the lower surface of a base end portion of the lead frame 9 and plastically deformable when subjected to a bending force to be applied to the base end portion when the lead frame 9 is bent.

The rib piece 72 is in contact with the lower surface of the base end portion of the lead frame 9, so that the bending force to be applied to the lead frame base end portion for bending the lead frame 9 toward the lower housing segment 71 is received by the rib piece 72. The rib piece 72 is plastically deformed by the bending force.

Thus, the bending force for the lead frame 9 is partly received by the rib piece 72, which in turn is plastically deformed, i.e., collapsed, with the bending force. This mitigates the reaction of the rib piece 72 to be exerted on the lead frame 9 during bending. Because the bending force is partly received by the rib piece 72 and also because the reaction of the rib piece 72 is diminished, the bending force acting directly on the base end portion of the lead frame 9 is attenuated to obviate the likelihood of the lead frame base end portion cracking.

DETAILED DESCRIPTION OF THE PREFERRED EMBODIMENTS (First Embodiment)

An embodiment of the invention will be described in detail with reference to the drawings.

A capacitor element 5 has the same construction as in the prior art. This embodiment has rib pieces 72 which project from a lower half housing segment 71 for supporting base end portions of respective lead frames 9, 90.

Figure 1:
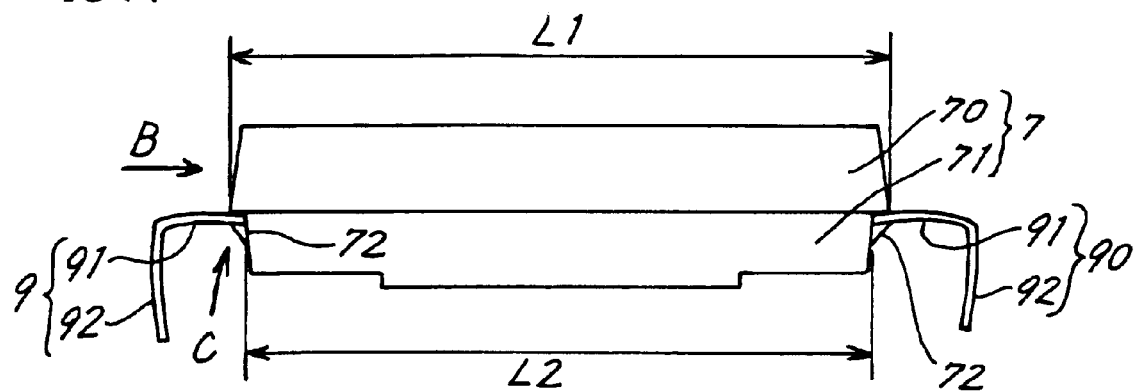
FIG. 1 is a front view of a solid electrolytic capacitor according to the invention.

FIG. 1 is a front view of a solid electrolytic capacitor according to the present embodiment and having second pieces 92 as bent downward. A housing 7 comprises an upper half housing segment 70 and a lower half housing segment 71. At the boundary between the two housing segments 70, 71, the lower segment 71 is smaller than the upper segment 70 in lateral length. Stated more specifically, at the location of projecting lead frames 9, 90, the upper surface of the lower housing segment 71 has a lateral length L2 which is shorter than the lateral length L1 of the lower surface of the upper housing segment 70.

The rib piece 72 is in contact with the lower surface of the lead frame 9 and projects from a side wall upper end portion of the lower housing segment 71. The rib piece 72, which is made of a synthetic resin, is formed simultaneously with the injection molding of the lower housing segment 71 and positioned inwardly of the upper housing segment 70. The lateral length L2 of upper surface of the lower housing segment 71 is made smaller than the lateral length L1 of lower surface of the upper housing segment 70 in order to provide the rib pieces 72. The construction wherein the lower housing segment 71 is smaller than the upper housing segment 70 in lateral length is a prior-art technique as disclosed in JP-B No. 3-30977. As previously stated, the present invention provides the lower housing segment with the rib pieces 72.

Figure 2:
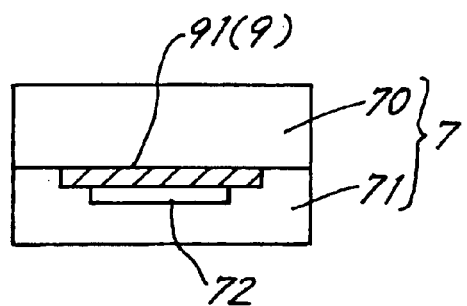
FIG. 2 is a view partly in section and showing the capacitor of FIG. 1 as seen from the direction B.

FIG. 2 is a view partly in section and showing the solid electrolytic capacitor of FIG. 1 as it is seen from the direction B, with the second piece 92 of the lead frame 9 omitted. The lead frame 9 is in the form of a plate, and the rib piece 72 is made smaller than the lead frame 9 in width.

Figure 3:
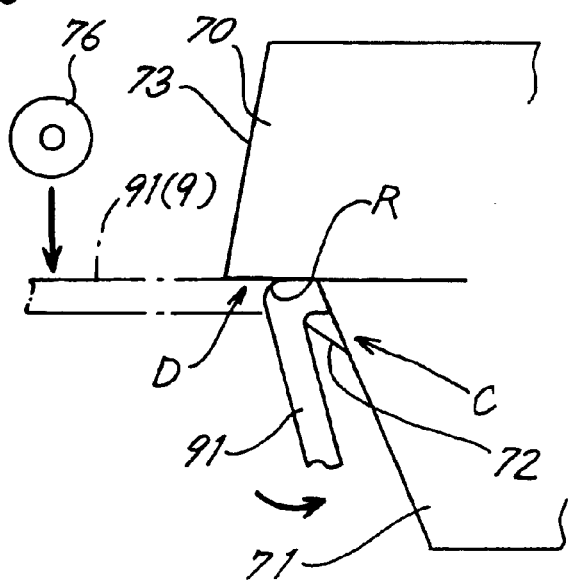
FIG. 3 is a diagram showing bending of a lead frame shown in FIG. 1 at a base end portion C thereof.

FIG. 3 is a diagram showing bending of the lead frame 9 of FIG. 1 at a base end portion C thereof. The first piece 91 of the lead frame 9 is bent downward by holding the housing 7 at the midportion thereof and lowering a roller 76 onto the lead frame 9 in the vicinity of its base end portion from above. To reduce the bending moment to be applied to the base end portion C of the lead frame 9, it is desirable that the distance from the location of contact of the roller 76 with the lead frame 9 to the base end portion C of the lead frame 9 be smaller. For example, the roller 76 may be moved down a tapered surface 73 of the upper housing segment 70.

The lead frame 9 is bent from a chain-line position shown in FIG. 3 to a solid-line position shown in the drawing. At this time, the rib piece 72 supports the lower surface of base end portion of the first piece 91 of the lead frame 9. The rib piece 72, which is made of a synthetic resin, is plastically deformed by the bending force acting thereon.

Thus, the bending force acting on the lead frame 9 is partly received by the rib piece 72. The rib piece 72 is plastically deformed, i.e., collapsed. This mitigates the reaction to be exerted by the rib piece 72 on the lead frame 9 when the frame 9 is bent. Because the bending force is partly received by the rib piece 72 and also because the reaction of the rib piece 72 is diminished, the bending force acting directly on the base end portion C of the lead frame 9 is attenuated. As shown in FIG. 3, the bent portion is in the form of a circular arc R, and the lead frame base end portion is prevented from cracking.

Because the rib piece 72 is plastically deformed, the bending of the lead frame 9 causes fragments of broken rib piece 72 to fall off. If the rib piece 72 has an excessive width, an increased amount of fragments of rib piece 72 will be produced to soil the apparatus for fabricating the solid electrolytic capacitor. To avoid this, the rib piece 72 is made smaller than the lead frame 9 in width. Further the portions of the lead frame 9 which are not in contact with the rib piece 72 are bent at an acute angle without assuming a circular-arc form, hence the advantage of providing a neat appearance to the finished product. However, if the portions out of contact with the rib piece 72 have an excessive length, there is the likelihood of permitting cracking. Rib pieces 72 which are too small in width are undesirable therefore.

(Second Embodiment)

In FIG. 3, the rib piece 72 is positioned inwardly of the upper housing segment 70, with the result that the lead frame 9 is separated from the upper housing segment 70 as indicated at D in FIG. 3. Fragments of upper housing segment 70 separating off will adhere to the lead frame 9 to result in an unsightly appearance. If dislodged, such separating fragments further produce an adverse effect on the electronic components to be arranged in the vicinity of the solid electrolytic capacitor.

Figure 4:
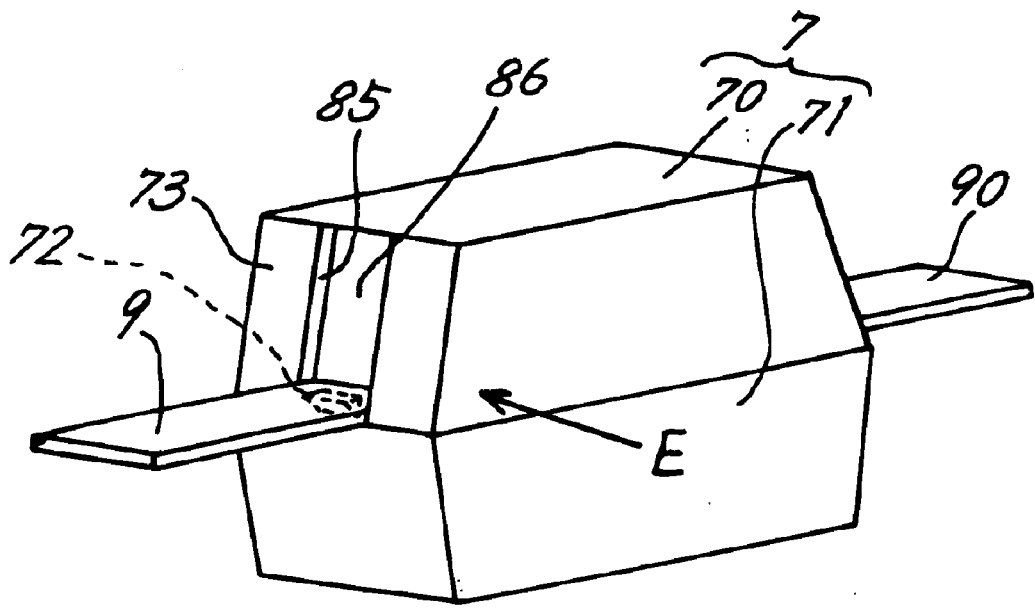
FIG. 4 is a perspective view showing another solid electrolytic capacitor.
Figure 5:
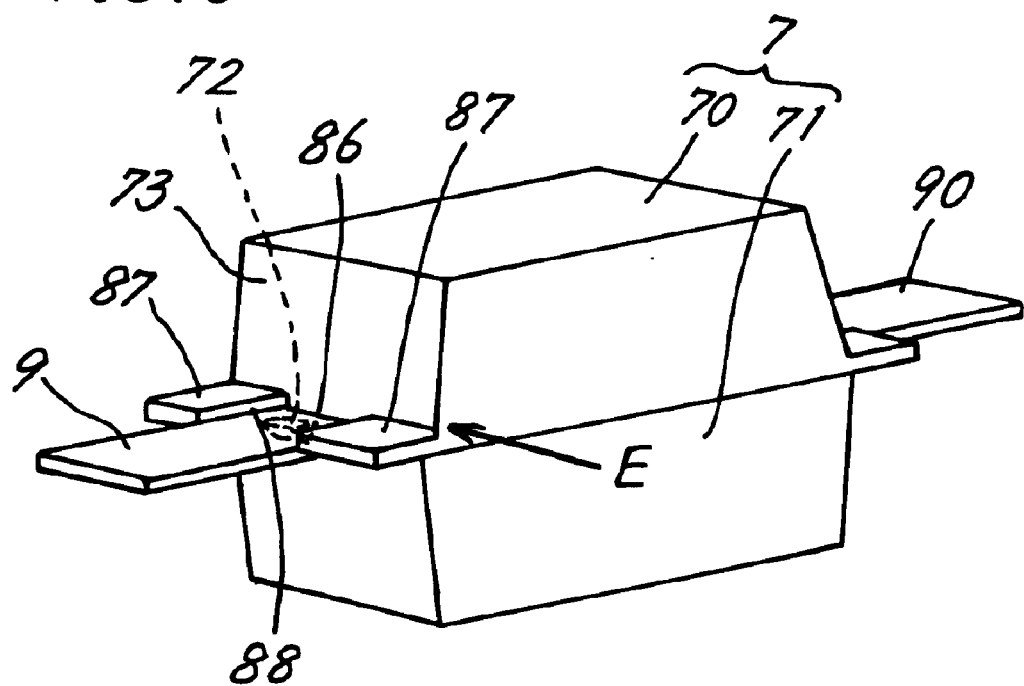
FIG. 5 is a perspective view showing another solid electrolytic capacitor.

Accordingly, the present applicant has contrived the following means. FIGS. 4 and 5 are perspective views showing other solid electrolytic capacitors. With reference to FIG. 4, an upper half housing segment 70 is provided in a side wall thereof with a grooved portion 85 extending upward or downward, and a lead frame 9 is positioned in the lower end of the grooved portion 85. A rib piece 72 is positioned under the lead frame 9.

Figure 6A:
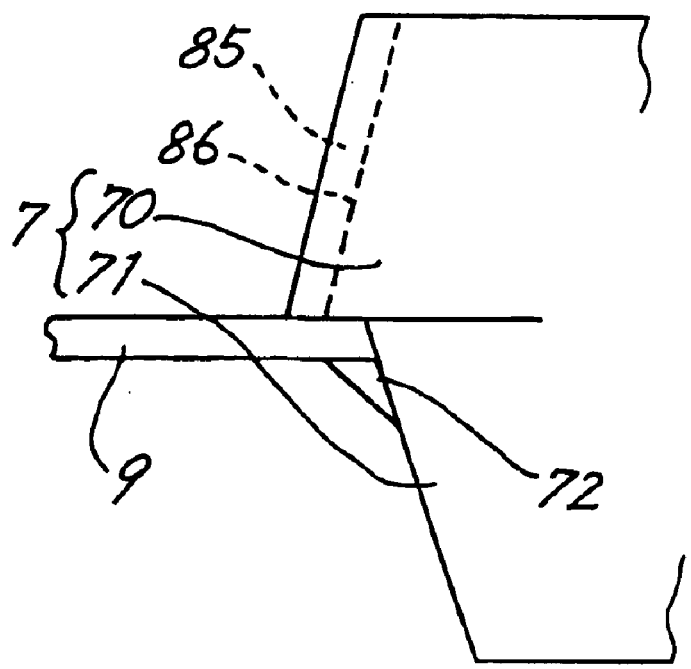
FIG. 6A is a view showing the capacitor of FIG. 4 as it is seen from the direction E.

FIG. 6A is a view showing the capacitor of FIG. 4 as it is seen from the direction E. The grooved portion 85 has a bottom face 86 the lower end of which is opposed to the forward end of the rib piece 72. Stated more specifically, the lower end of the bottom face 86 of the grooved portion 85 laps over the forward end of the rib piece 72 with the lead frame 9 positioned therebetween. Accordingly, even if the lead frame 9 is bent downward about the base end portion thereof, the lead frame 9 is unlikely to separate from the upper housing segment 70. This eliminates the likelihood that separating fragments will adhere to the lead frame 9.

Figure 6B:
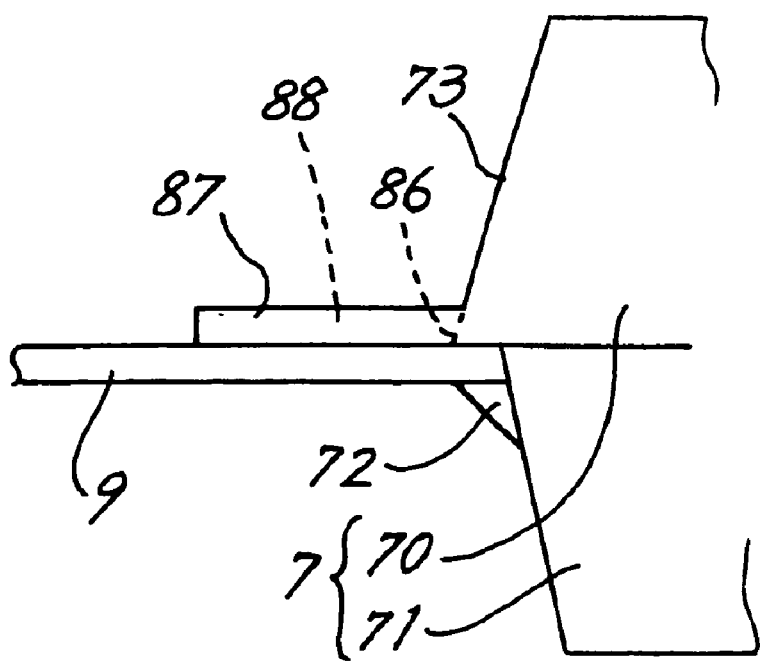
FIG. 6B is a view showing the capacitor of FIG. 5 as it is seen from the direction E.
Figure 7:
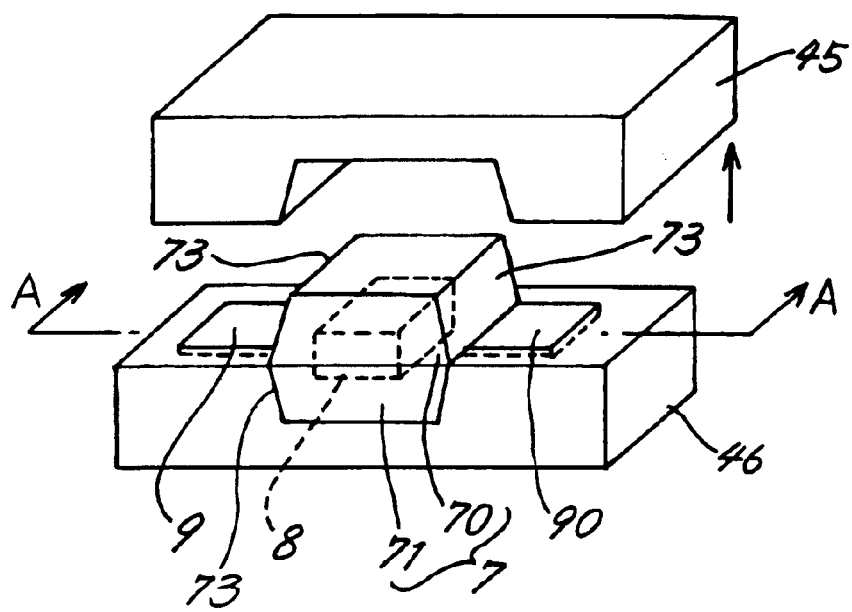
FIG. 7 is a perspective view showing a process for fabricating a conventional solid electrolytic capacitor of the chip type.
Figure 8:
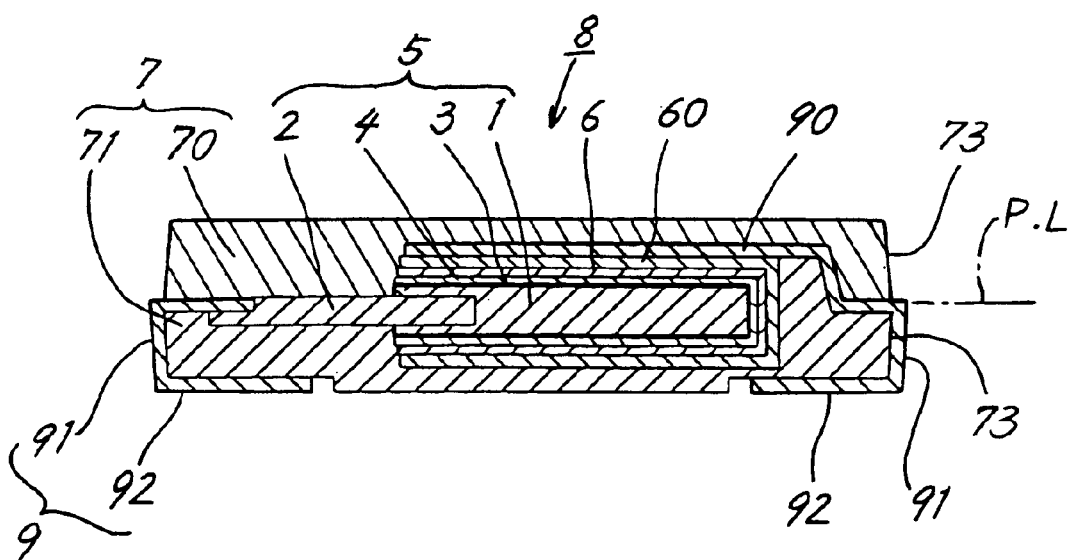
FIG. 8 is a view in section taken along a plane containing the line A—A and showing the capacitor of FIG. 7.
Figure 9:
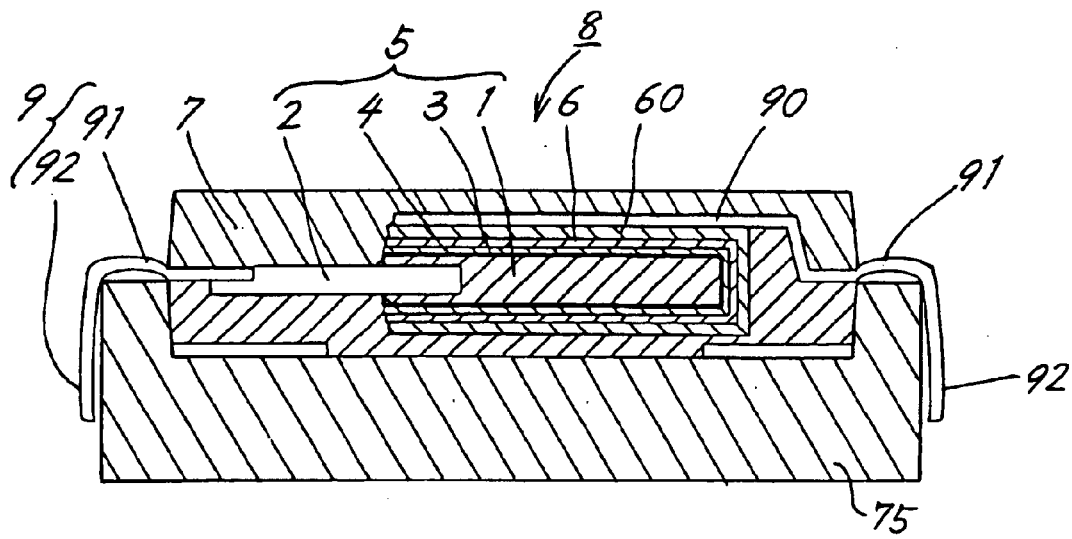
FIG. 9 is a front view in section showing a conventional method of bending lead frames.
Figure 10:
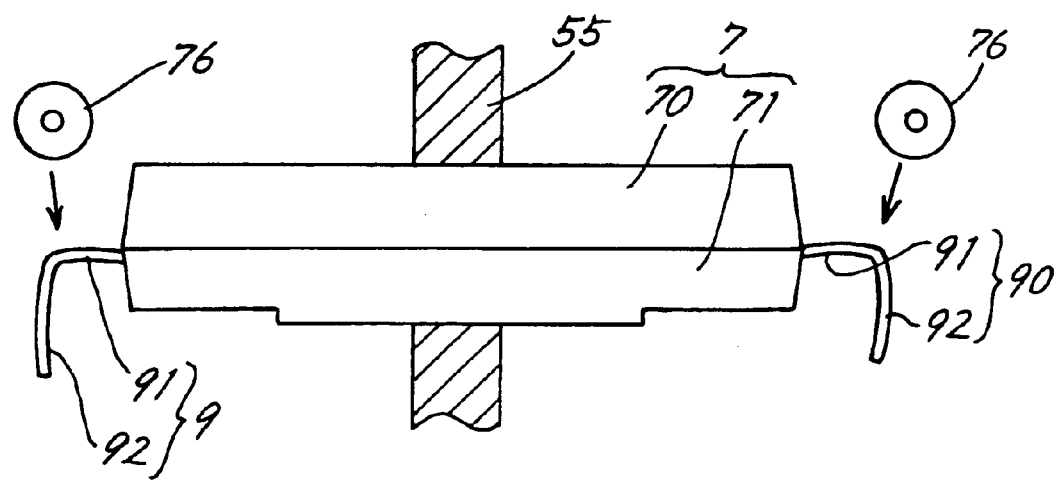
FIG. 10 is a front view showing the conventional method of bending the lead frames.

Further with reference to FIG. 5, an upper half housing segment 70 is provided with overhanging plates 87, 87 projecting from a lower end portion thereof and spaced apart widthwise of the segment, and a lead frame 9 is disposed within a recessed portion 88 between the overhanging plates 87, 87. FIG. 6B is a view showing the capacitor of FIG. 5 as it is seen from the direction E. The lower end of the recessed 88 at the bottom face 86 of the upper housing segment 70 is opposed to the forward end of a rib piece 72. Even if the lead frame 9 is bent downward about the base end portion thereof as in the above case, the lead frame 9 is unlikely to separate from the upper housing segment 70. Especially, the solid electrolytic capacitor shown in FIG. 5 can be fabricated merely by using the upper die 45 shown in FIG. 7 for forming a conventional capacitor, with lower end portions of the die shaped by cutting in conformity with the shape of the overhanging plates 87, 87.

Although solid electrolytic capacitors are used as embodiments of electronic components, such components may be ICs or like parts having bent lead frames 9, 90.

Although the lead frame 9, 90, which project from the lower housing segment 71, may alternatively be made to project from the upper housing segment 70.

It is desired that capacitors of the type described be further reduced in ESR, and it is thought feasible to prepare the lead frame 9, 90 from a highly conductive material such as copper, silver, gold or the like. However, such a material is low in bending strength, and the lead frames 9, 90 made from an alloy of such a material which is improved in bending strength are more susceptible to cracking than those made from an iron-nickel alloy. The applicant contemplates use of a copper alloy containing chromium (Cr) and tin (Sn) added thereto.

When such a material is used for the lead frames 9, 90, provision of the rib pieces of the embodiments serves to prevent cracking. Making the lead frames 9, 90 from highly conductive copper, silver, gold or the like or an alloy of such a material results in reduced ESR.

What is claimed is:

1. An electronic component comprising an upper half housing segment and a lower half housing segment, a lead frame projecting laterally from the location of a boundary between the two housing segments and to be bent downward toward the lower housing segment, the electronic component being characterized in that a rib piece in contact with a lower surface of a base end portion of the lead frame projects from a side wall upper end portion of the lower housing segment and is plastically deformable when subjected to a bending force to be applied to the base end portion when the lead frame is bent.

2. An electronic component according to claim 1 wherein the lower housing segment is shorter than the upper housing segment in lateral length at the location of the boundary between the two housing segments, and the rib piece is positioned inwardly of the upper housing segment.

3. An electronic component according to claim 1 wherein the rib piece is smaller than the lead frame in width.

4. An electronic component according to claim 1 wherein the lead frame is provided within a recessed portion or a grooved portion formed in a side wall of the upper housing segment, and a bottom face of the recessed portion or the grooved portion has a lower end formed at a depth so as to be opposed to a forward end of the rib piece.

5. An electronic component according to claim 1 wherein the lead frame is made from a material selected from among copper, silver, gold and alloys of these metals.

* * * * *